(12) United States Patent
Onishi et al.

(10) Patent No.: US 8,218,591 B2
(45) Date of Patent: Jul. 10, 2012

(54) LASER DIODE WITH RIDGE WAVEGUIDE STRUCTURE AND METHOD FOR MANUFACTURING THE SAME

(75) Inventors: Yutaka Onishi, Yokohama (JP); Hideki Yagi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 27 days.

(21) Appl. No.: 12/971,476

(22) Filed: Dec. 17, 2010

(65) Prior Publication Data

US 2011/0164642 A1 Jul. 7, 2011

(30) Foreign Application Priority Data

Dec. 24, 2009 (JP) ................................ 2009-292560

(51) Int. Cl.
*H01S 3/04* (2006.01)
(52) U.S. Cl. ......................................................... 372/34
(58) Field of Classification Search ..................... 372/34
See application file for complete search history.

(56) References Cited

U.S. PATENT DOCUMENTS

2009/0141764 A1 6/2009 Yagi et al.

OTHER PUBLICATIONS

Aoki, et al., "InP-Based Reversed-Mesa Ridge-Waveguide Structure for High-Performance Long-Wavelength Laser Diodes", IEEE Journal of Selected Topics in Quantum Electronics, vol. 3, No. 2, Apr. 1997, pp. 672-683.

*Primary Examiner* — Tod T. Van Roy
*Assistant Examiner* — Marcia A. Golub-Miller
(74) *Attorney, Agent, or Firm* — Smith, Gambrell & Russell, LLP

(57) ABSTRACT

An LD with an improved heat dissipating function in the edge regions is disclosed. The LD provides the core region including the active layer and extending whole of the substrate, and the ridge waveguide structure on the core region that extends in a direction along which the light generated in the active layer is guided. The ridge waveguide structure is buried by a thick resin layer in both sides thereof, but the resin layer is removed in the edge regions close to respective facets of the LD.

9 Claims, 18 Drawing Sheets

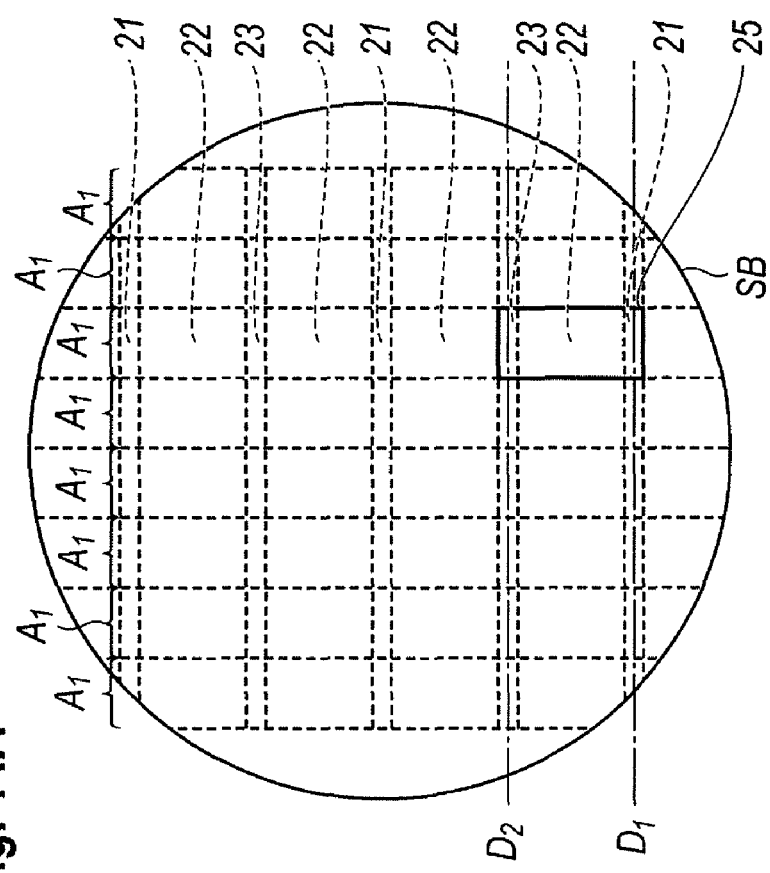
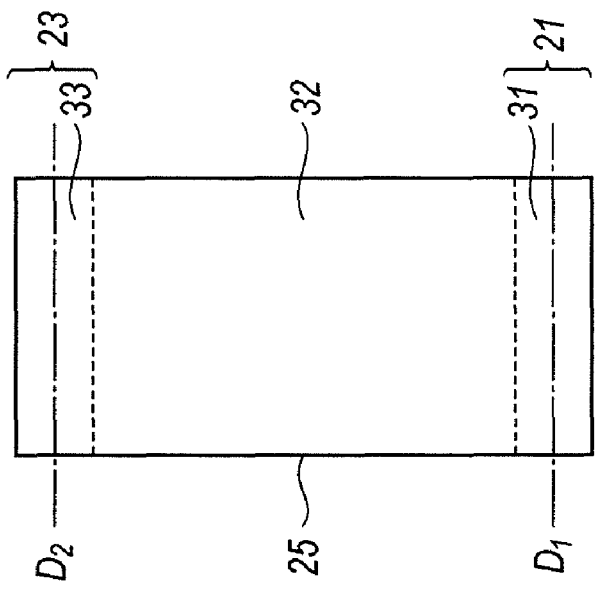
Fig. 14A
Fig. 14B

_US 8,218,591 B2_

LASER DIODE WITH RIDGE WAVEGUIDE STRUCTURE AND METHOD FOR MANUFACTURING THE SAME

BACKGROUND OF THE INVENTION

1. Field of the Invention

The present invention relates to a semiconductor laser diode (hereafter denoted as LD) with a ridge waveguide structure, and a method to manufacture the LD.

2. Related Prior Art

In an LD with the ridge waveguide structure, the active layer accompanied with optical confinement layers extends in a plane, but a waveguide with a striped structure extending in one direction within the plane is formed above the laterally extending active layer, and the ridge waveguide made of semiconductor materials is buried with the burying layer. The United States Patent published as US 20090141764A or Aoki et al. in IEEE Quantum Electronics, vol. QE-3(2), (1997), pp. 672 have disclosed one type of the LD with the ridge waveguide structure with a burying layer made of resin. This resin layer extends from one facet of the LD to the other facet. In such an LD, semiconductor materials including the burying layer to bury the ridge waveguide structure are put between two electrodes. This arrangement equivalently forms a parallel plate capacitor. In order to operate the LD in quite high speed, for instance, over 10 Gbps, not only the junction capacitance but the parasitic capacitance must be reduces as possible. One solution is that an area of the upper electrode provided on the burying layer is narrowed. The LDs disclosed in the prior arts above set the burying layer thick enough to reduce the parallel plate capacitance.

SUMMARY OF THE INVENTION

However, when the burying layer is made of resin, the resin used therein has inferior thermal conductivity of about 0.3 W/m/K quite lesser than those of semiconductor materials; accordingly, a thicker burying layer shows an inferior heat dissipating function. The ridge structure in an intermediate portion between two facets continues to semiconductor materials in both end portions thereof, while, the facets of the ridge waveguide structure are exposed to an air through the coating film and the thermal conductivity of air is only 0.0241 W/m/K which is far less than that of the resin. Accordingly, the heat dissipating function of the LD with the ridge waveguide structure becomes inferior in edge portions thereof compared with that of the intermediate portion. An inferior heat dissipating function results in an increase of the temperature in the active layer and ultimately degrades the reliability of the device.

One aspect of the present invention relates to an arrangement of an LD of the ridge waveguide type. The LD according to the present invention comprises a semiconductor substrate, a core region, a ridge waveguide structure, an insulating layer, a resin layer, and an electrode. The substrate provides two edge regions and a central region put between the edge regions. The core region which is provided on the substrate includes an active layer that laterally extends in a whole substrate. The ridge waveguide structure, which is provided on the core region, has a striped shape extending in a direction along which the light generated in the active layer propagates and includes a cladding portion. The insulating layer is provided on a top and sides of the ridge waveguide structure and on the core region. The insulating layer has a window aligned with the ridge waveguide structure. The resin layer buries the ridge waveguide structure in the central region of the substrate. The electrode extends from one facet to another facet of the LD along the direction. The electrode directly comes in contact to the cladding portion through the window. A feature of the LD according to the present invention is that the edge regions of the substrate may provide no resin layer thereon; the electrode is provided on the top and sides of the ridge waveguide structure and on the core region so as to come in directly contact to the insulating layer in the edge regions, while the it is provided on the top of the ridge waveguide structure and the top of the resin layer in the central region.

The arrangement of the LD according to the present invention may enhance the heat dissipating function in the edge regions because the electrode comes in directly contact to the thin insulating layer without interposing the thick resin layer there.

Another aspect of the present invention relates to a method to form an LD of a ridge waveguide type. The method may include steps of: (a) forming a ridge waveguide structure on a semiconductor substrate that includes first to third regions arranged along an axis, where the ridge waveguide structure includes a ridge portion and a cap layer on the ridge portion; (b) covering a top and sides of the ridge waveguide structure by an insulating layer; (c) burying the ridge waveguide structure with the insulating layer by a resin layer; (d) etching the resin layer in the first and third regions as leaving the resin layer in the second region, where the insulating layer is exposed in the first and third regions; (e) removing the insulating layer in the top of the ridge waveguide structure, and removing the cap layer exposed by the etching of the insulating layer; and (f) forming an electrode on the ridge waveguide structure. A feature of the present method is that the step of forming the electrode is carried out such that the electrode comes in contact to the ridge portion and the resin layer in the second region but in the first and third regions, the electrode comes in contact to the ridge portion and directly to the insulating layer.

BRIEF DESCRIPTION OF DRAWINGS

The foregoing and other purposes, aspects and advantages will be better understood from the following detailed description of a preferred embodiment of the invention with reference to the drawings, in which:

FIG. 14A is a plan view showing a process to carry out the cleavage of the semiconductor substrate thus processed; and FIG. 14B magnifies one chip cleaved from the processed semiconductor substrate;

DETAILED DESCRIPTION OF PREFERRED EMBODIMENTS

Next, some preferred embodiments according to the present invention will be described as referring to accompanying drawings. In the description of the drawings, the like elements will be referred by the like numerals or the symbols without overlapping explanations.

First Embodiment

Figure 1:
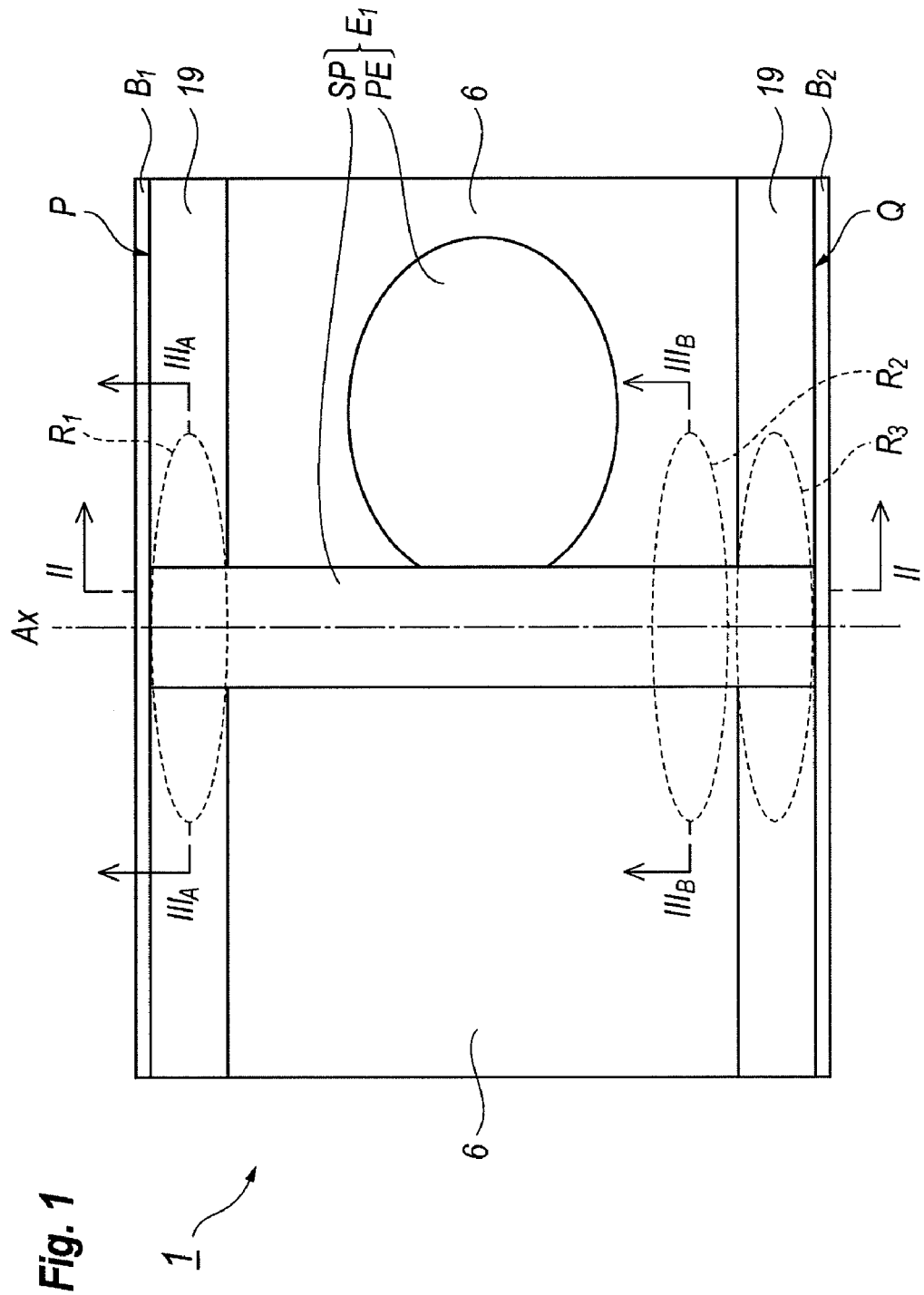
FIG. 1 is a plan view of the LD with the ridge waveguide structure according to the first embodiment of the present invention.

An LD with the ridge waveguide structure according to an embodiment of the present invention will be described as referring to FIGS. 1 to 3. FIG. 1 is a plan view of the LD 1 with the ridge waveguide structure. The LD 1 provides no resin layer 6 in edge regions of the device. Edge regions close to one facet P and to the other facet Q of the LD 1 has no resin layer 6; accordingly, an insulating layer 19 exposes thereat. The stripe SP of the first electrode $E_1$, which provides an upper electrode of the LD 1, extends from the facet P to the other facet Q along the axis Ax. In the present embodiment, the axis Ax corresponds to a direction along which the light is guided.

Figure 2:
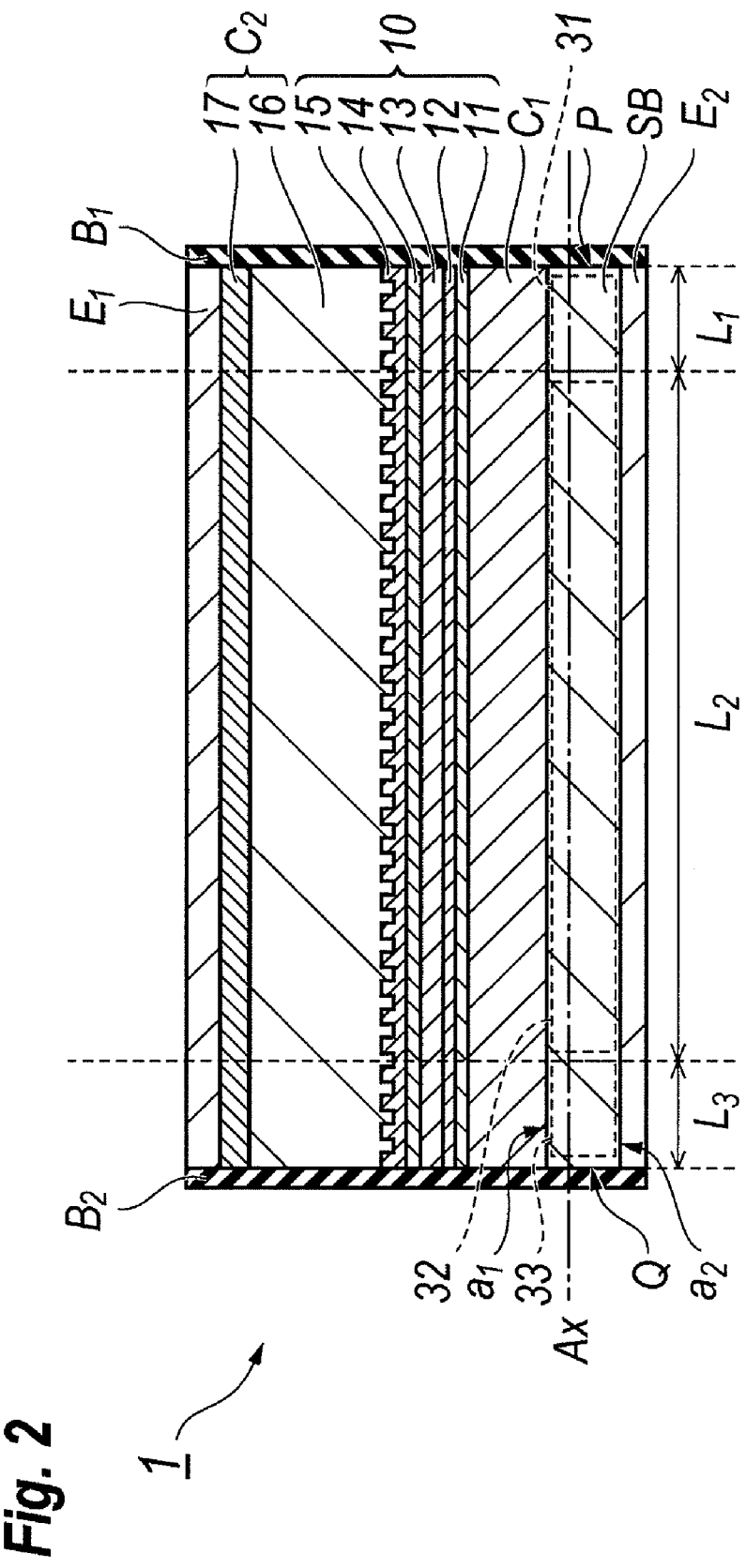
FIG. 2 is a cross section of the LD taken along the line II-II in FIG. 1.

FIG. 2 is a cross section taken along the line II-II appeared in FIG. 1. As shown in FIG. 2, the LD 1 with the ridge waveguide structure comprises a semiconductor substrate SB, a lower cladding layer $C_1$, a core region 10, a ridge waveguide $C_2$, the first electrode $E_1$ and the second Electrode $E_2$. The semiconductor substrate SB includes an edge region 31, a central region 32, and another edge region 33. The lower cladding layer $C_1$ is arranged on the primary surface $_{a1}$ of the semiconductor substrate SB. The core region 10 is arranged on the lower cladding layer $C_1$, and includes a lower optical confinement layer 11, an active layer 12, an upper optical confinement layer 13, a carrier stopping layer 14, and a grating layer 15. The ridge waveguide $C_2$ is arranged on the core region 10 and extends along the axis Ax. The ridge waveguide $C_2$ includes the upper cladding layer 16 and the contact layer 17. The first electrode $E_1$ is arranged on the contact layer 17.

Figure 3A:
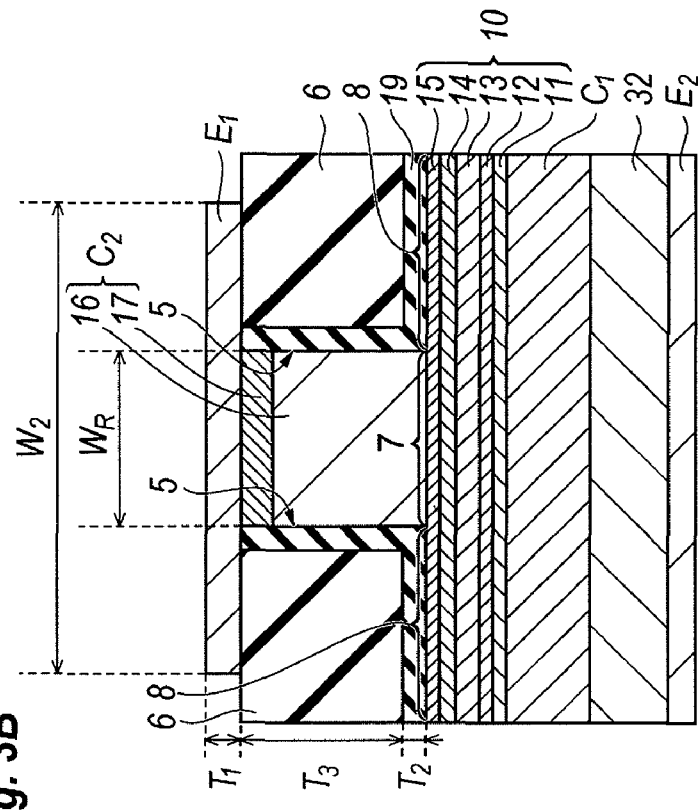
FIG. 3A is a cross section of the LD taken along the line $III_A$-$III_A$ shown in FIG. 1

FIG. 3A is a cross section of a region $R_1$ taken along the line $III_A$-$III_A$ in FIG. 1 which is close to the facet P. A cross section in another region $R_3$ close to the other facet Q is substantially same with those shown in FIG. 3A. The edge region 31 corresponds to a region $R_1$ in FIG. 1, while, the other edge region 33 corresponds to the other region $R_3$. The LD 1 further includes an insulating layer 19 and a resin layer 6. The insulating layer 19 is arranged so as to cover the ridge waveguide $C_2$ and the core region 10. The insulating layer 19 provides an opening in a top of the upper cladding region $C_2$; that is, the insulating layer 19 covers the side 5 of the ridge waveguide $C_2$ and the top of the grating layer 15. The first electrode $E_1$ is arranged on the insulating layer 19 and on a portion of the resin layer 6.

The core region 10 includes a first portion 7 and second portions 8 arranged in respective sides of the first portion 7. The first portion 7 of the core region 10 arranges the ridge waveguide $C_2$ thereon but the second portions 8 arranges no ridge waveguide $C_2$. The cross section of the ridge waveguide $C_2$ is not restricted in those illustrated in FIGS. 3A and 3B. For instance, the second portion 8 may arrange the ridge waveguide $C_2$ thereof but a thickness thereof is less than that those in the first portion 7. In such a case, the portion of the ridge waveguide $C_2$ on the second portion 8 in addition to the insulating layer 19 may isolate the second portion 8 from the first electrode $E_1$.

The insulating layer 19 extends the whole of the device including the edge region 31, the central region 32, and the other edge region 33. In other words, the insulating layer 19 extends along the axis Ax from the facet P to the other facet Q so as to cover the sides of the ridge waveguide $C_2$ and the second portion 8 of the core region 10. The insulating layer 19 may prevent the first electrode $E_1$ from coming in contact with the sides of the ridge waveguide $C_2$ and the second portion 8 of the core region 10, which restricts the current path to the top of the ridge waveguide $C_2$. Because the edge regions, 31 and 33, provide no resin layer 6 thereon, the insulating layer 19 comes in contact with the first electrode $E_1$ thereat.

Figure 3B:
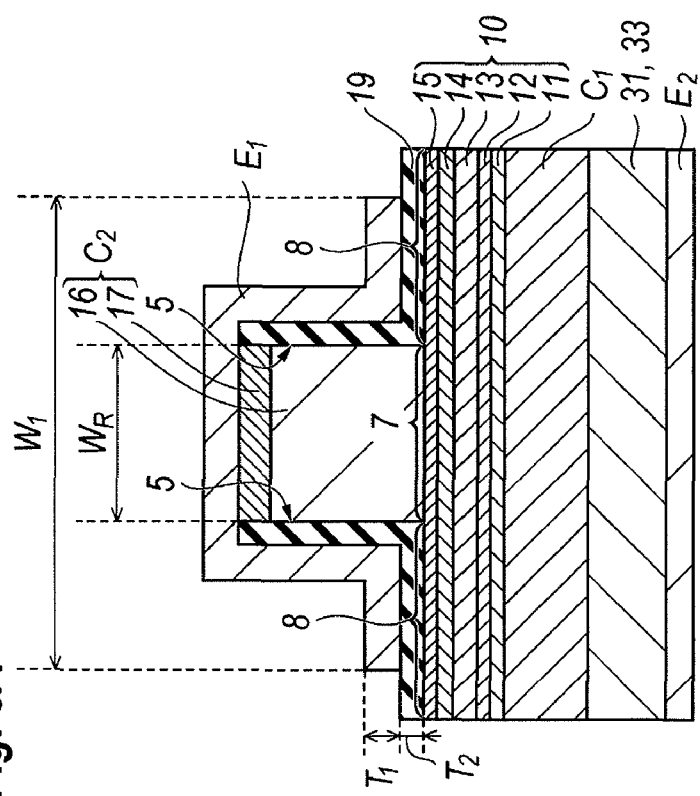
FIG. 3B is a cross section of the LD taken along the line $III_B$-$III_B$ in FIG. 1.

FIG. 3B is a cross section taken along the line $III_B$-$III_B$ shown in FIG. 1, which corresponds to the cross section of the second region $R_2$ in the central region 32. In the central region 32, the resin layer 6 buries the ridge waveguide $C_2$ and comes in contact with the insulating layer 19. The insulating layer 19 may prevent the resin layer 6 from peeling off from the ridge waveguide $C_2$ and the core region 10 in the central region 32.

The LD 1 according to the present embodiment, the resin layer 6 comes in contact with the side of the insulating layer 19 in the central region 32, while, the first electrode $E_1$ covers the insulating layer 19 in the sides 5 of the ridge waveguide $C_2$ in the edge regions, 31 and 33. The thermal conductivity of the first electrode $E_1$ is greater than that of the resin layer 6; for instance, the thermal conductivity of gold (Au), which is generally contained in the first electrode $E_1$, is about 315 W/m/K which is three digits greater than that of the benzocyclobutene (BCB) typically used as the resin of the resin layer. Accordingly, heat generated in the edge regions, 31 and 33, may be conducted to the first electrode $E_1$ through the insulating layer 19 covering the sides 5 of the ridge waveguide $C_2$ and dissipated therefrom.

The first electrode $E_1$ includes the stripe SP and the pad PE connected to the stripe SP in the central region 32, as shown in FIG. 1. The width $W_1$ of the SP in the edge regions, 31 and 33, is substantially equal to the width $W_2$ in the central region 32. The width $W_1$ in the edge regions, 31 and 33, is preferably greater than a width $W_R$ of the ridge waveguide $C_2$ to prevent the ridge waveguide $C_2$ from increasing the current density abruptly. Meanwhile, the width $W_2$ of the stripe SP in the central region 32 is preferably greater than the width of the ridge waveguide $W_R$, as shown in FIG. 3B, which may also prevent the current flowing in the ridge waveguide from increasing abruptly.

The strip SP may have the width $W_1$ in the edge regions, 31 and 33, from 5 to 20 μm, while, in the central region 32, the strip SP may have the width $W_2$ of also 5 to 20 μm. The width $W_1$ less 5 μm causes the abrupt increase of the current density and sometimes results in a melt of the ridge waveguide $C_2$ in the worst case. A width, $W_1$ or $W_2$, of the stripe exceeding 20 μm causes to increase the parasitic capacitance felt in the first electrode $E_1$. The first electrode $E_1$ may have a thickness greater than 300 nm to enhance the heat dissipation. Because the parasitic capacitance is substantially independent of the thickness $T_1$ thereof, the first electrode $E_1$ is preferable to have an enough thickness $T_1$.

The insulating layer 19 is preferable to have a thickness $T_2$ from 50 to 500 nm. The thickness $T_2$ less than 50 nm degrades the electrical isolation between the ridge waveguide $C_2$ and the first electrode $E_1$, while, the thickness $T_2$ greater than 500 nm degrades the heat dissipating function of the edge regions, 31 and 33. The insulating layer 19 shown in FIGS. 3A and 3B has the thickness $T_2$ in the edge regions, 31 and 33, and also in the central region 32; that is, the thickness of the insulating layer 19 is substantially constant in the whole regions, 31 to 33. However, the present invention is not restricted to those arrangements. The insulating layer 19 in the edge regions, 31 and 33, may have a thickness $T_2$ less than a thickness thereof in the central region 32, which may enhance the heat dissipating characteristic in the edge regions, 31 and 33.

Referring to FIG. 2, the edge regions, 31 and 33, may have a length $L_1$ of 10 to 50 μm along the axis Ax. A length $L_1$ less than 10 μm causes the decrease of the heat dissipating function in the edge regions, 31 and 33; while, a length $L_1$ greater tan 50 μm results in the increase of the parasitic capacitance.

Respective layers constituting the LD 1 with the ridge waveguide structure will be further described. The semiconductor substrate SB may be an n-type InP doped with silicon (Si). The lower cladding layer $C_1$ may be made of n-type semiconductor material such as InP, GaInAsP, GaInAs, AlGaInAs, AlInAs, and so on with a thickness of about 100 nm. An n-type dopant contained in the lower cladding layer $C_1$ above described may be Si.

The core region 10 is a stack of semiconductor layers, in which the active layer 12 may have a multiple quantum well structure including a plurality of well layers and a plurality of barrier layers alternately stacked to each others, or a bulk structure of an unique layer. The active layer may be made of GaInAsP, GaInAs, AlGaInAs, AlInAs, and so on. The lower and upper optical confinement layers, 11 and 13, which may effectively confine light generated in the active layer 12 within the active layer 12 and the optical confinement layers, 11 and 13, but show lesser function for confining injected carriers, may be made of un-doped semiconductor material such as GaInAsP, GaInAs, AlGaInAs, AlInAs, and so on. The lower and upper optical confinement layers, 11 and 13, may be, if necessary, an n-type or a p-type semiconductor layers doped with respective dopant. The core region 10 and the substrate SB may have a system of the InP substrate combined with the GaInAsP core region, a GaAs substrate with a GaInNAs core region or an InAs quantum dot core region.

The carrier stopping layer 14 may be a p-type semiconductor layer, for instance, made of p-type AlInAs doped with zinc (Zn), and have a thickness of about 30 nm. The grating layer 15 may be made of p-type semiconductor material doped with Zn, for instance Zn-doped GaInAsP. The grating layer 15 provides an optical grating which has a periodic corrugated surface along the axis Ax. The grating layer 15 may have a thickness of about 60 nm. When the LD/is a type of the distributed feedback (DFB) laser, the grating layer 15 is inevitable; however, the LD 1 may be the Fabry-Perot type without the optical grating.

The ridge waveguide $C_2$ may be made of semiconductor material; for instance, it is made of p-type semiconductor material. Specifically, the upper cladding layer 16 may be made of InP, GaInAsP, GaInAs, AlGaInAs, AlInAs, and so on. The upper cladding layer 16 preferably has a bandgap wavelength less than that of the active layer 12 and that of the upper optical confinement layer 13 in order to inject carriers into the active layer 12 efficiently. The bandgap wavelength corresponds to the wavelength at which the photoluminescence from the semiconductor material becomes the maximum and substantially proportional to the inverse of the bandgap energy. The contact layer 17 makes an ohmic contact with the first electrode $E_1$, and may be made of p-type semiconductor material with lesser bandgap energy heavily and doped with p-type dopant; specifically, the contact layer 17 may be made of GaInAsP, GaInAs, and so on.

The resin layer 6 may be made of insulating material; specifically, it may be made of BCB described above, polyimide, and so on. The resin layer 6 using such BCB and polyimide may be formed and treated by an ordinary semiconductor process. Because of the insulating characteristic thereof, the resin layer 6 may operate as a current blocking layer to concentrate injected carried into the ridge waveguide $C_2$. The resin layer 6 preferably has a thickness $T_3$ of greater than 1 μm in the central region 32. The resin layer 6 with a thickness less than 1 μm causes the increase of the parasitic capacitance.

The first and second electrodes, $E_1$ and $E_2$, may be made of a stacked metal of titanium (Ti), platinum (Pt), and gold (Au). The facet P may provide a film $B_1$ with high reflectivity to increase the magnitude of the output light, while, the other facet Q may provide another film $B_2$ with relatively lower or substantially zero reflectivity to prevent the light reflected thereat from causing optical noise.

A table below summarizes the arrangement of the optical device shown in FIGS. 1 to 3:

TABLE 1

| Arrangement of Laser Diode | |
|---|---|
| Semiconductor Substrate SB: | n-InP, t = 100 μm |
| Lower Cladding Layer $C_1$: | n-InP, t = 0.5 μm |
| Lower Opt. Confinement Layer 11: | n-AlGaInAs, t = 60 nm, Eg = 1.10 μm |
| Active Layer 12: | MQW structure: |
| Well: | un-AlGaInAs, t = 6 nm, Eg = 1.3 μm |
| Barrier: | un-AlGaInAs, t = 9 nm, Eg = 1.1 μm |
| Upper optical confinement Layer 13: | un-AlGaInAs, t = 60 nm, Eg = 1.1 μm |
| Carrier Stopping Layer 14: | p-AlInAs, t = 40 nm |
| Grating Layer 15: | p-GaInAsP, t = 60 nm, Eg = 1.2 μm, corrugation depth = 30 nm |
| Upper Cladding Layer 16: | p-InP, t = 2.0 μm, width = 2.0 μm |
| Contact Layer 17: | p-GaInAs, t = 300 nm |
| Burying Layer 6: | BCB, t = 5 μm |
| Insulating Layer 19: | $SiO_2$, t = 300 nm |

Figure 4:
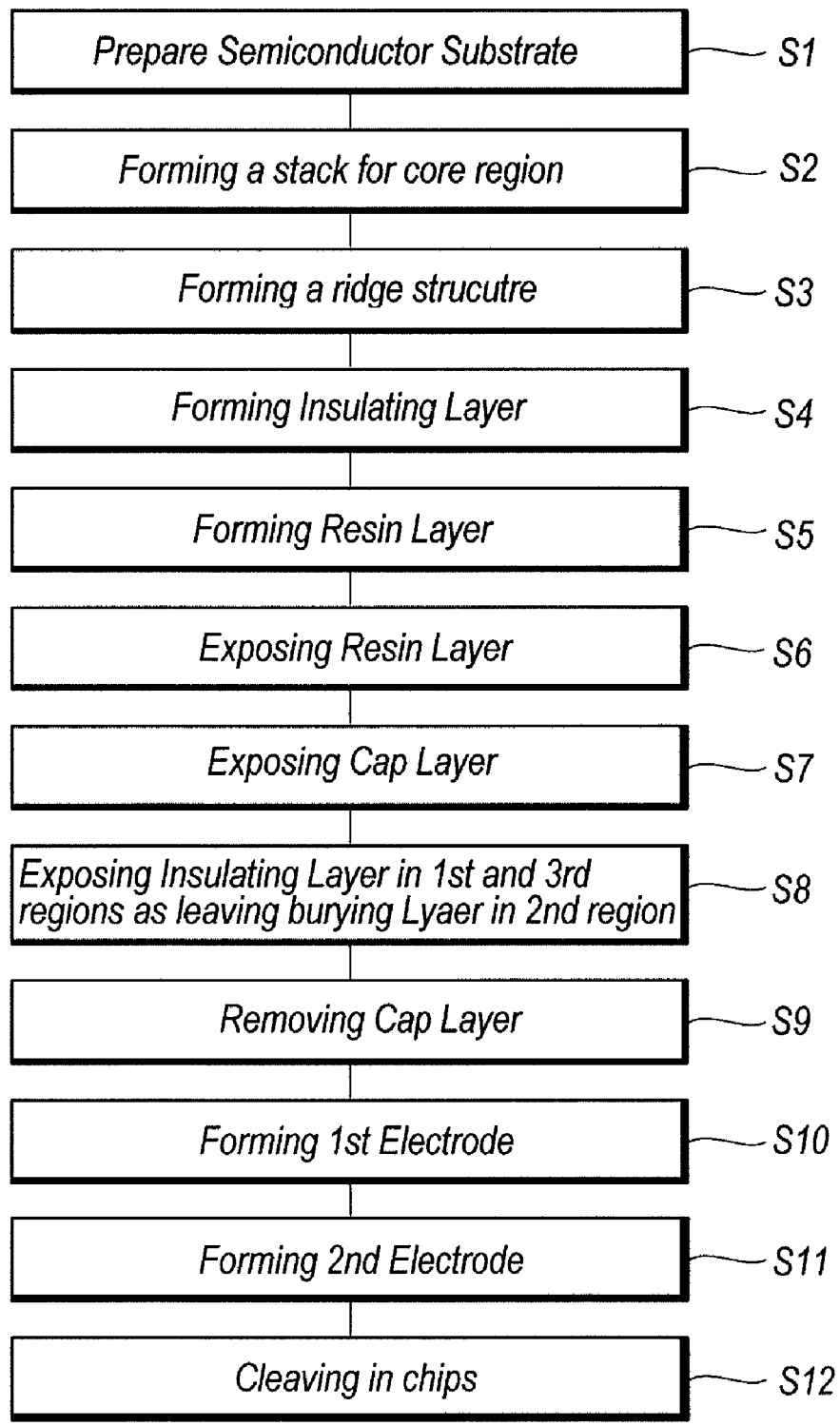
FIG. 4 is a flowchart of the process for manufacturing the LD with the ridge waveguide structure shown in FIG. 1.
Figure 5B:
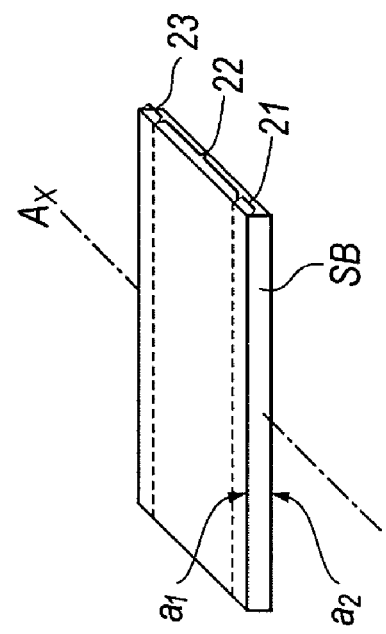
FIG. 5A is a plan view of a semiconductor substrate for the LD shown in FIG. 1, and FIG. 5B magnifies one chip contained in the wafer.
Figure 5A:
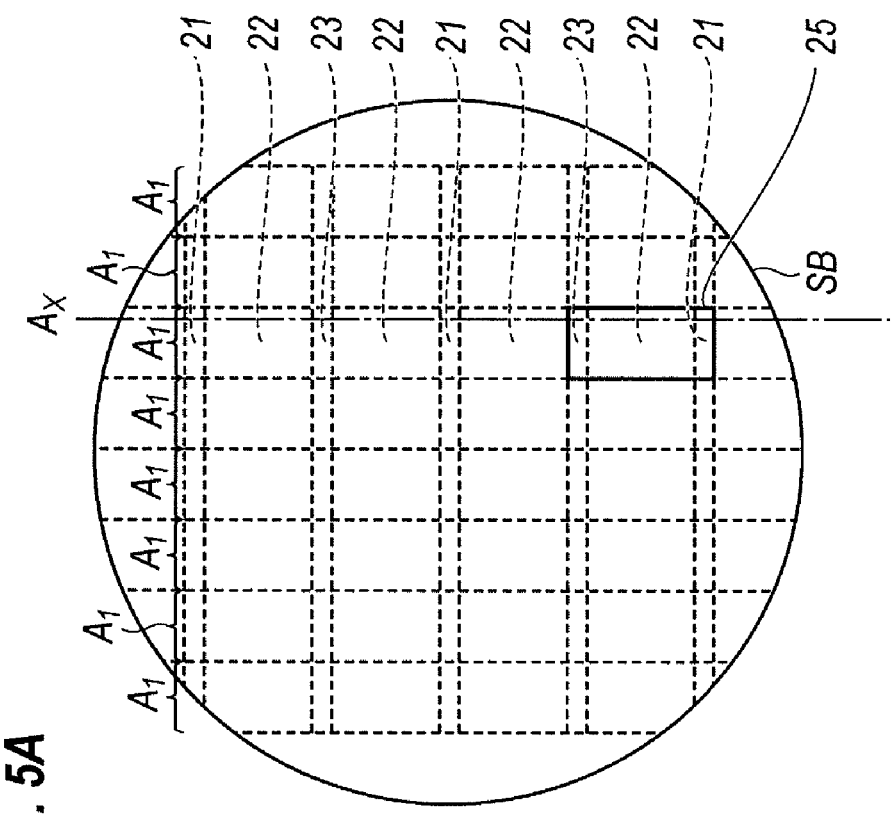

Next, a method to manufacture the LD 1 according to another embodiment of the present invention will be described. FIG. 4 shows a flow chart of a process to manufacture the LD 1 with the ridge waveguide structure. Referring to FIG. 4, step S1 prepares a semiconductor substrate SB. FIGS. 5A and 5B illustrate step S1, in which FIG. 5A is a plan view of a semiconductor substrate SB that includes a plurality of arrayed chips $A_1$ laterally arranged within the substrate SB. Each area $A_1$ includes the first region 21, the second region 22, and the third region 23, where the first and third regions put the second region therebetween. FIG. 5B magnifies one area 25, which is one of chips $A_1$. The explanation below concentrates on the specific chip 25, but rest chips $A_1$ are processed in a similar manner at the same time.

Figure 6A:
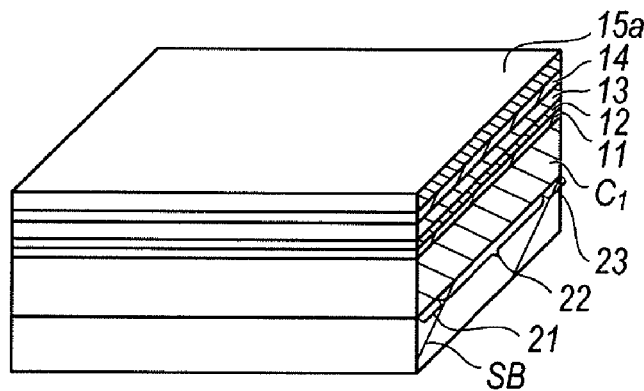
FIG. 6A shows a process to form a a stack including semiconductor layers on the semiconductor substrate.
Figure 6B:
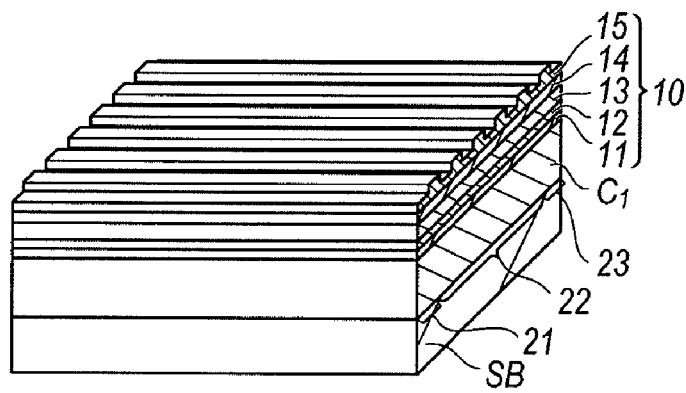
FIG. 6B shows a process to form an optical grating in the stack.
Figure 6C:
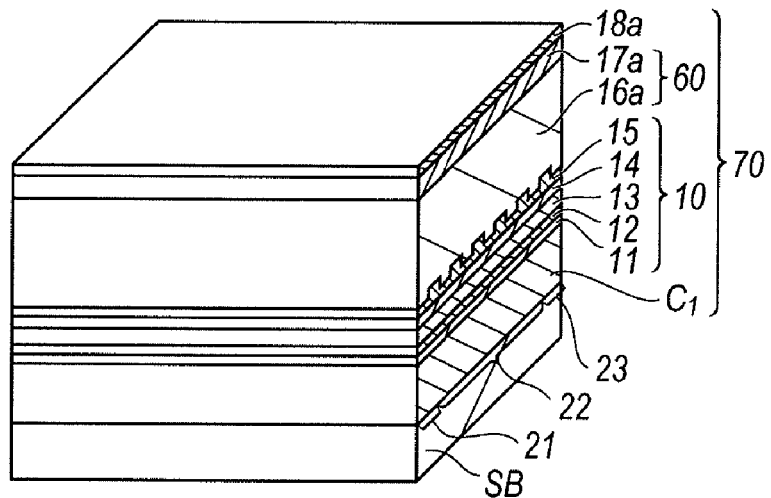
FIG. 6C shows a process to re-grow additional semiconductor layers on the optical grating.

Referring to FIG. 4 again, step S2 forms a stack of semiconductor regions for the core 10. FIGS. 6A to 6C show processes to form the core region 10. First, the lower cladding layer $C_1$ and the core region 10 that includes several semiconductor layers, 11 to 15, are grown on the whole surface $_{a1}$ of the substrate SB, that is, the semiconductor layers are grown on the regions, 21 to 23, in this order by the organic metal vapor phase epitaxy (hereafter denoted as OMVPE) technique. Specifically, as shown in FIG. 6A, the lower optical confinement layer 11, the active layer 12, the upper optical confinement layer 13, the carrier stopping layer 14, the grating layer 15a and the cover layer (not shown in FIG. 6A) are grown by the OMVPE technique. The grating layer 15a may be a p-type GaInAsP doped with Zn and having a thickness of 60 nm. The cover layer may be a p-type InP also doped with Zn and having a thickness of 10 nm. A process subsequently forms an insulating layer made of silicon die-oxide ($SiO_2$) on the cover layer with a thickness of about 100 nm. The grating pattern may be transcribed on the insulating layer by patterning a photoresist by the EB-exposure and dry-etching the insulating layer by the photoresist pattern as an etching mask. Then, removing the photo-resist, further dry etching the cover layer and the grating layer 15a, the optical grating may be formed in the grating layer 15 as shown in FIG. 6B. The insulating layer is removed after the formation of the optical grating. Thus, the core region 10 including several semiconductor layers, 11 to 15, are formed on the lower cladding layer $C_1$. The explanation above may be applicable for manufacturing a DFB-LD with the ridge waveguide structure; however, an LD with the Fabry-Perot type may omit the process to form the grating layer 15.

Step S2 further forms an origin 60 of the ridge waveguide and an origin 18a for the cap layer on the core region 10 by the OMVPE technique. The former origin 60 includes the origin of the upper cladding layer 16 and the origin 17a of the contact layer in this order from the side of the core region 10. The origin 16a of the upper cladding layer may be a p-type InGaAs doped with Zn and having a thickness of about 2 μm, while the latter origin 17a for the contact layer may be a Zn-doped InGaAs with a thickness of about 300 nm. The origin 18a of the cap layer may be a Zn-doped InP with a thickness of about 100 nm. Thus, step S2 forms the lower cladding layer $C_1$, the core region 10, the origin 60 for the ridge waveguide, and the origin 18a for the cap layer.

Figure 7A:
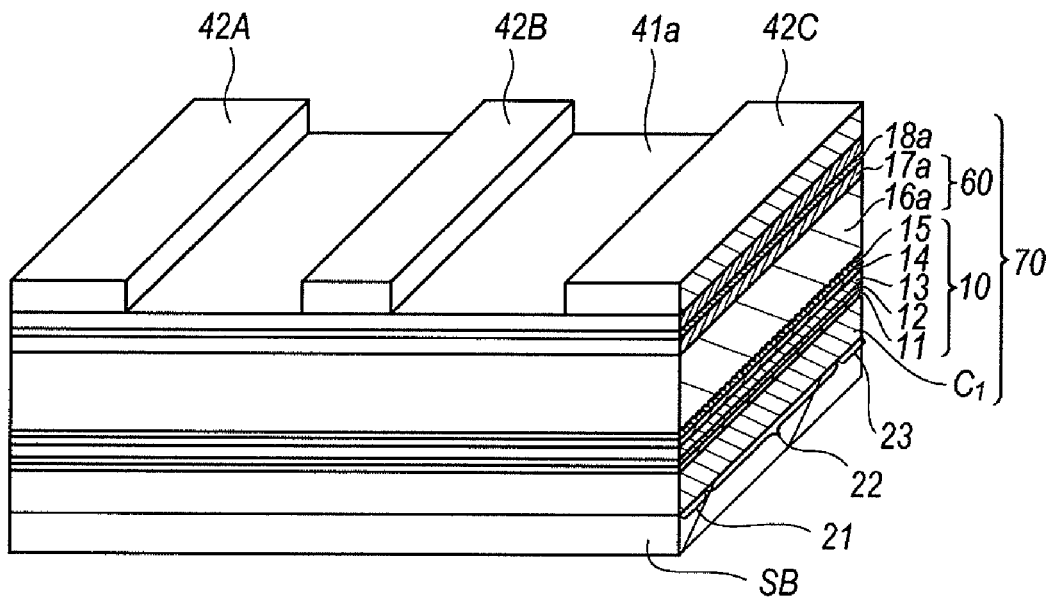
FIGS. 7A and 7B show processes to form an etching mask on the semiconductor layers.
Figure 7B:
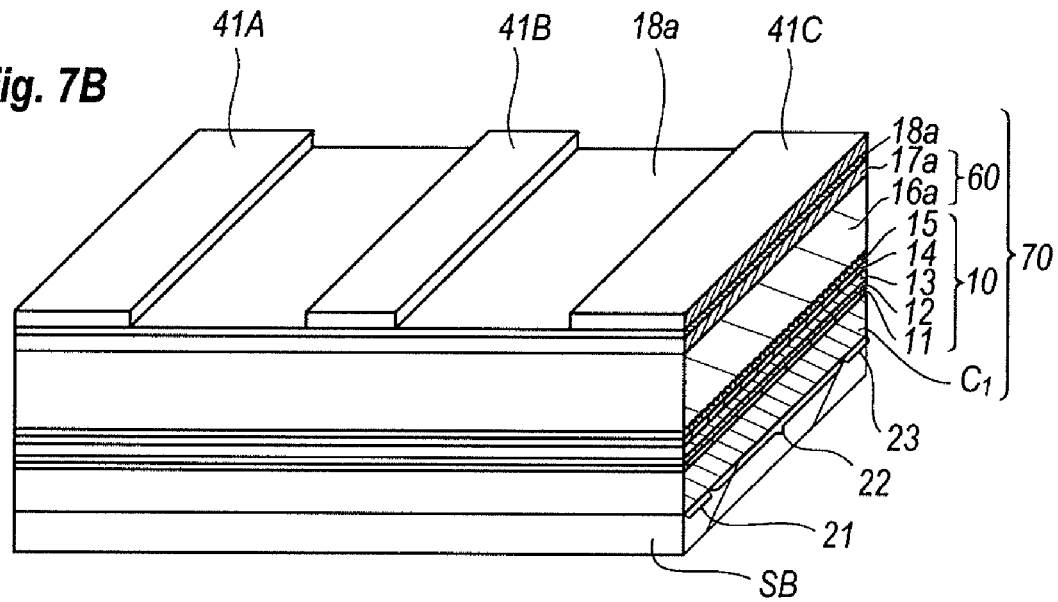
Figure 8A:
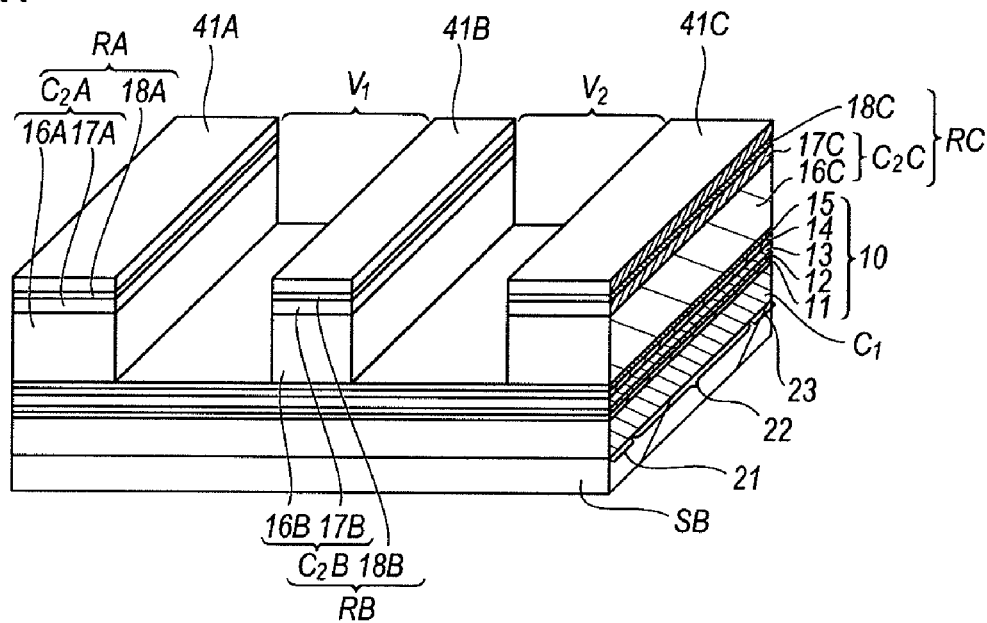
FIG. 8A shows a process to etch the semiconductor layers to form a ridge waveguide structure.

Subsequently, the process forms the ridge waveguide that contains two origins, 60 and 18a, at step S3. FIGS. 7 to 8A show step S3, where FIGS. 7A and 7B explains the patterning of semiconductor layers 70. Step S3 first forms an insulating layer 41a, which may be made of silicon nitride (SiN) with a thickness of about 300 nm grown by the chemical vapor deposition (hereafter denoted as CVD) technique, on the origin 18a for the cap layer. Next, patterns, 42A to 42C, of photoresist to be used as an etching mask are developed on the insulating layer 41a by the photolithography technique. The photoresist patterns, 42A to 42C, are arranged along a direction perpendicular to the axis Ax with a predetermined space.

The reactive ion etching (hereafter denoted as RIE) may etch the insulating layer 41a by the photoresist patterns as the etching mask. The RIE may use carbon fluoride ($CF_4$) as an etching gas. Ashing using gaseous oxygen ($O_2$) may remove the photoresist patterns, 42A to 42C, on the insulating layer 41a after the transcribing the patterns, 41A to 41C, on the insulating layer 41a, as shown in FIG. 7B. The patterns, 41A to 41C, transcribed on the insulating layer 41a each extends along the axis Ax with the predetermined space to the next pattern.

FIG. 8A illustrates the ridge waveguide structure. Step S3 of the present embodiment dry-etches the original layers, 18a and 60, for the cap layer and the upper cladding layer, respectively, by using the RIE technique by the patterns, 41A to 41C, as the etching mask. The ridge waveguide structures, RA to RC, are formed on the core region 10 by this etching. Respective ridge waveguide structures, RA to RC, include the cladding portion, $C_2A$ to $C_2C$, and the cap layer, 18A to 18C. Further, the respective cladding portions, $C_2A$ to $C_2C$, include the upper cladding layer, 16A to 16C, and the contact layer, 17A to 17C. The ridge structures, RA to RC, each extends along the axis Ax and separated by grooves, $V_1$ and $V_2$. Specifically, the groove $V_1$ is put between the ridge structures, RA and RB, while, the other groove $V_2$ is arranged between the ridge structures, RB and RC.

When the cladding portions, $C_2A$ to $C_2C$, are made of compound semiconductor material of InP family, which means that the compound semiconductor material has a lattice constant substantially equal to, or within a range where the crystal growth on InP is enabled, the dry etching of those semiconductor material may be carried out by using chloride based etching gas. A wet process to remove damages due to the dry etching may be carried out when it is necessary. The insulating patterns, 41A to 41C are removed after the dry etching by, for instance, buffered fluoric acid. Thus, the process according to the present embodiment may form the ridge waveguide structures, RA to RC, on the substrate SB that includes the regions, 21 to 23, and the primary surface $a_1$, each extending along the axis Ax, where each of ridge structures, RA to RC, includes the cladding portion, $C_2A$ to $C_2C$, and the cap layer, 18A to 18C, on the cladding portion, $C_2A$ to $C_2C$.

Figure 8B:
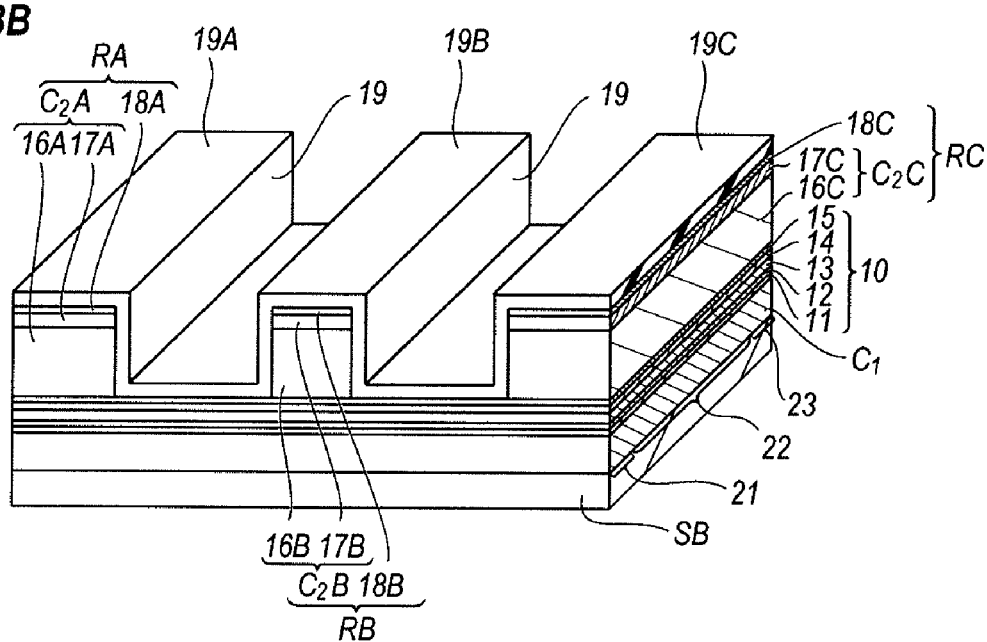
FIG. 8B shows a process to cover the ridge waveguide structure by an insulating layer.

Referring to FIG. 4 again, step S4 according to the present embodiment forms an insulating layer 19. FIG. 8B illustrates a process to form the insulating layer 19. Specifically, a plasma-enhanced CVD (hereafter denoted as p-CVD) may form the insulating layer 19 so as to cover the sides of the ridge structures, RA to RC. The insulating layer 19 may cover not only the sides but the top of the ridge structures, RA to RC; that is, referring to FIG. 8B, the first portion 19A of the insulating layer 19 covers the top of the first ridge RA, the second portion 19B covers the top of the second ridge RB, and the third portion 19C covers the top of the third ridge RC. Another type of the insulating layer 19 may be made of silicon die-oxide ($SiO_2$) formed by atmospheric CVD technique under a temperature of 400° C. by a mixture of silane ($SiH_4$) and oxygen ($O_2$) as a source gas.

Figure 9A:
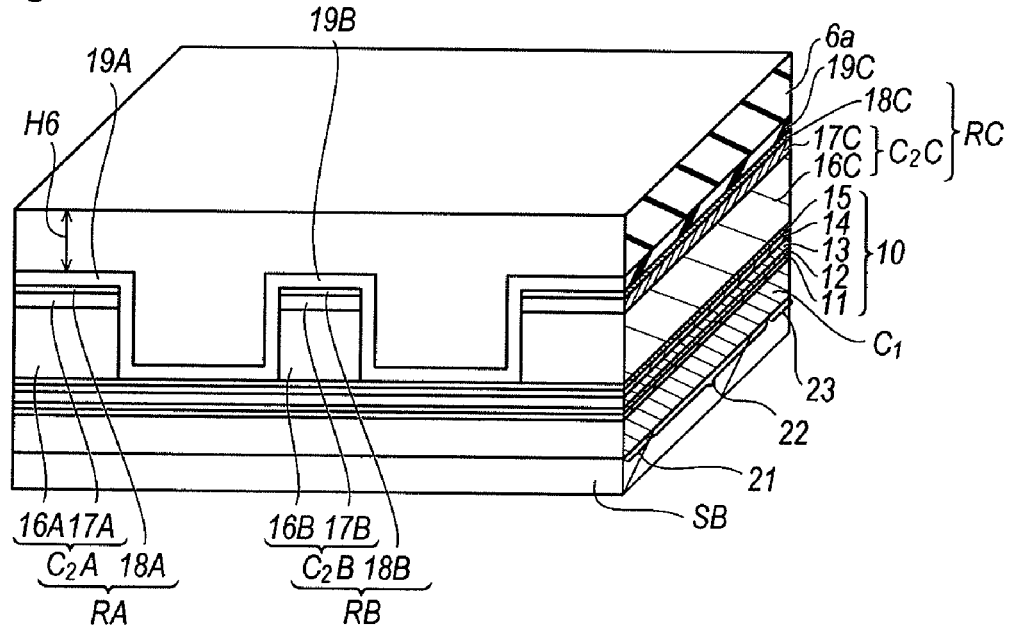
FIG. 9A shows a process to bury the ridge waveguide structure by the resin layer.

Referring to FIG. 4 again, step S5 according to the present embodiment forms the resin layer 6a. Specifically, step S5 forms, on the insulating layer 19, the resin layers 6a that buries the ridge structures, RA to RC, and two grooves, $V_1$ and $V_2$. As shown in FIG. 9A, the resin layer 6a covers the whole substrate SB. The ridge structures, RA to RC, and grooves, $V_1$ and $V_2$, are buried by the resin layer 6a. As already described, the resin layer 6a may be made of resin such as BCB and polyimide. At least one (1) μm of the resin layer 6a is necessary around the ridge structures, RA to RC, to prevent the ridge structures, RA to RC, from receiving mechanical damage. Taking loss in a thickness of the resin layer 6a during the etching of the insulating layer 19 into account, the thickness $H_6$ of the resin layer 6a is preferably at least 1.3 µm as being formed but less than 1.8 µm because an excess thickness of the resin layer 6 results in the inferior coverage of the first electrode $E_1$, which sometimes causes a breakage of the electrode $E_1$ at the edges thereof.

Figure 9B:
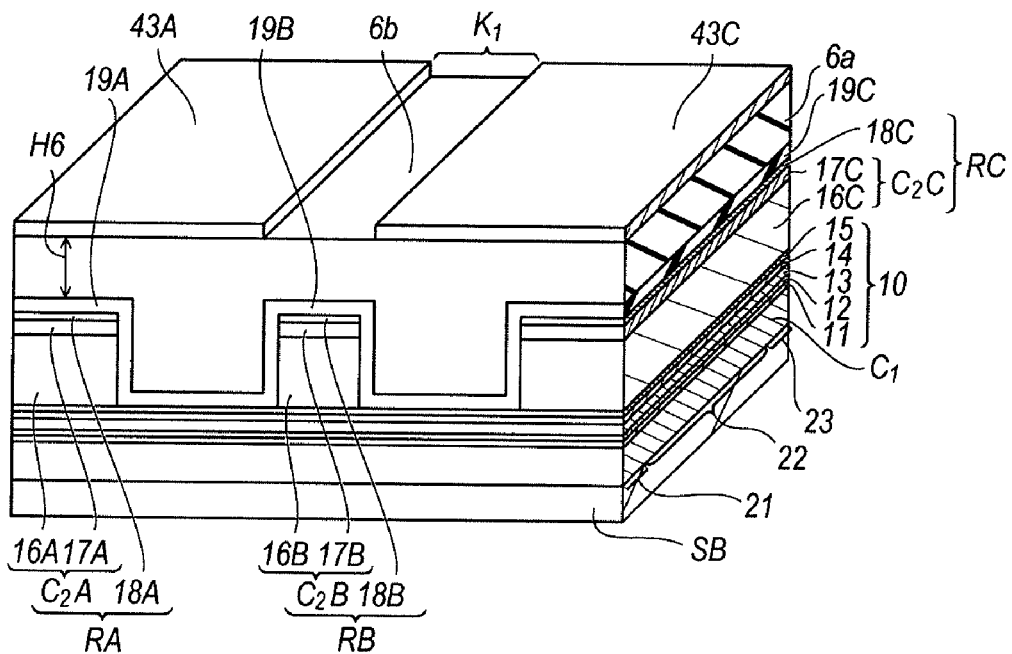
FIG. 9B shows a process to form a mask for etching a portion of the resin layer and a portion of the insulating layer on the ridge waveguide structure.
Figure 10A:
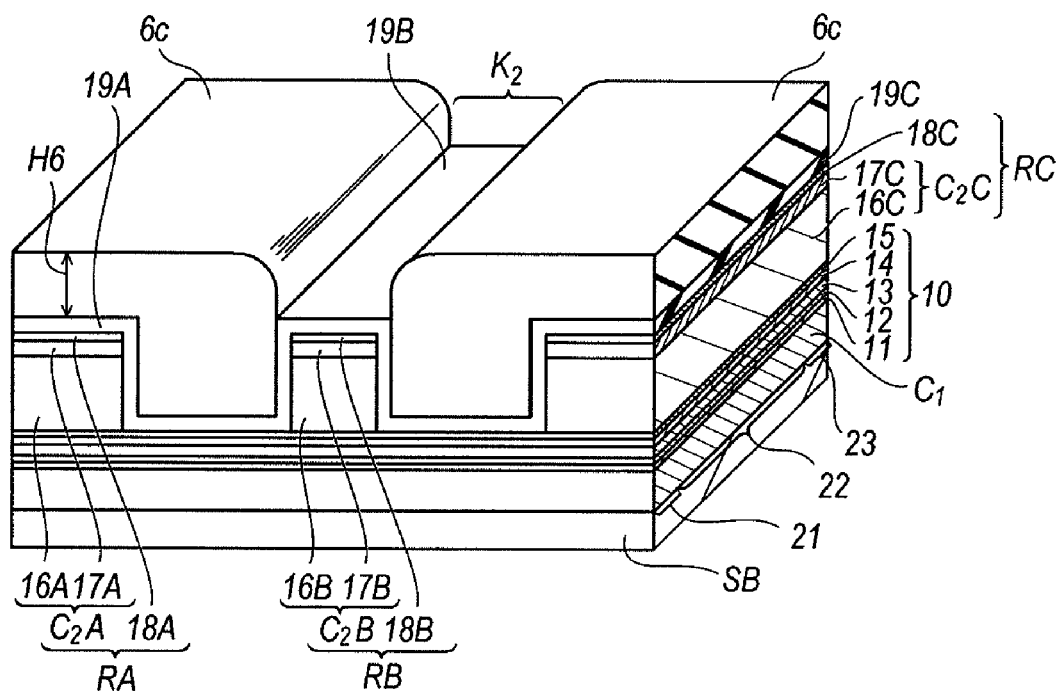
FIG. 10A shows a process to expose a top of the portion of the insulating layer.

Referring to FIG. 4 again, step S6 according to the present invention exposes the insulating layer 19. FIGS. 9B and 10A show processes to expose the insulating layer 19. Step S6 first forms a photoresist pattern on the resin layer 6a by the ordinary photolithography technique, as shown in FIG. 9B. The pattern 43A covers the first ridge structure RA and the first groove $V_1$, while the other pattern 43C covers the third ridge structure RC and the second groove $V_2$, but no pattern is provided above the second ridge structure RB. A window $K_1$ between two patterns, 43A and 43C, is formed above the center ridge structure RB.

Step S6 further etches a portion 6b of the resin layer 6a which is exposed in the window $K_1$ between the mask patterns, 43A and 43C. This dry etching using the mixture of carbon fluoride ($CH_4$) and oxygen ($O_2$) forms the window $K_2$ in the resin layer 6a so as to leave other portions 6c of the resin layer 6a. The window $K_2$ exposes the top 19B of the insulating layer 19. The mask patterns, 43A and 43C, are removed by an organic solvent after the dry etching as shown in FIG. 10A.

Figure 10B:
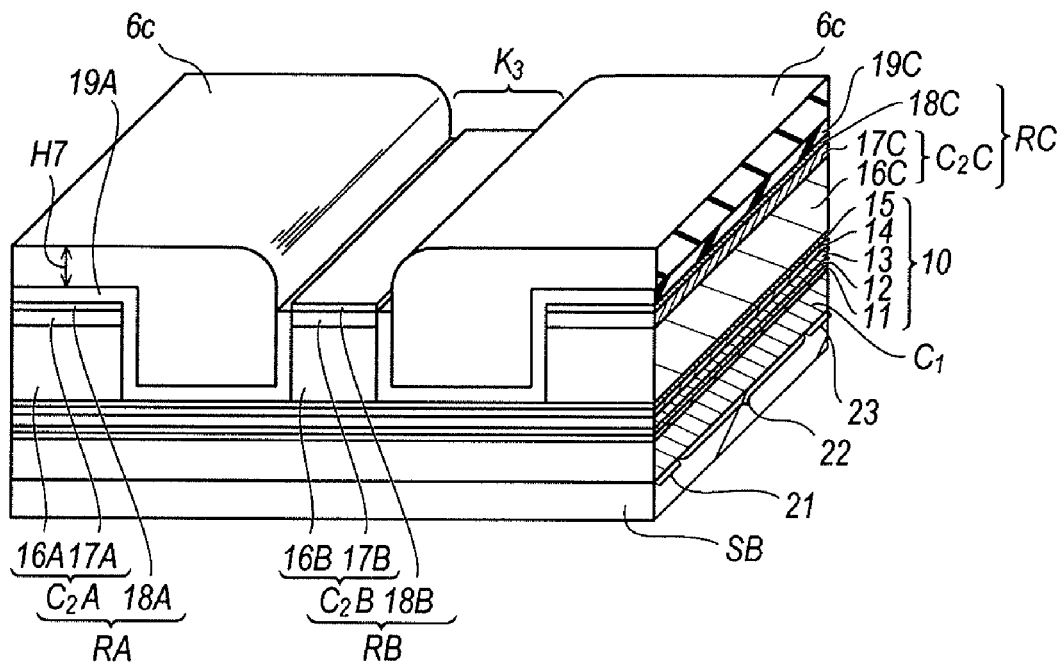
FIG. 10B shows a process to etch the exposed insulating layer.
Figure 11:
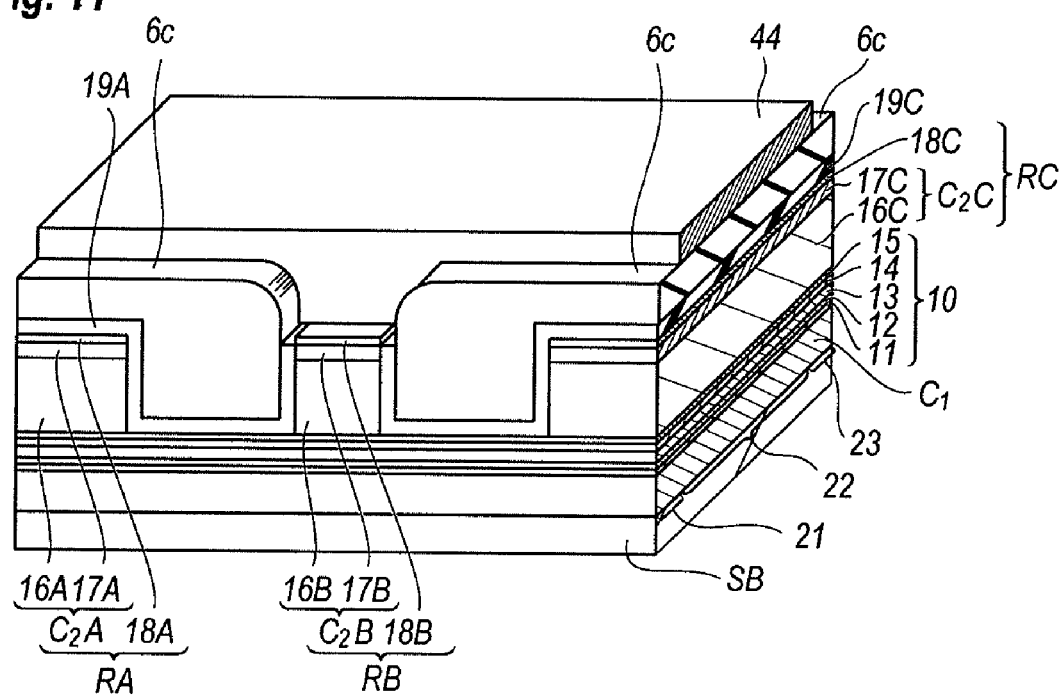
FIG. 11 shows a process to form a mask pattern for removing the edge regions of the resin layer.

Step S7 according to the present embodiment exposes the cap layer 18B on the top of the center ridge structure $R_B$. FIGS. 10B and 11 explains step S7. Specifically, the RIE technique may etch a top portion of the resin layer 6c and the top portion 19B of the insulating layer 19, which may form a window $K_3$ in the resin layer 6a. Further etching of the top portion 19B of the insulating layer 19 forms a window there. The cap layer 18B in the top of the center ridge RB is exposed within the window $K_3$. FIG. 10B shows the process to expose the cap layer 18B, where the insulating layer 19 in both sides of the cap layer 18B is removed.

Step S8 of the present embodiment exposes the insulating layer 19 in the first and third regions, 21 and 23, as leaving in the second region 22. Step S8 first forms a mask pattern 44 made of photoresist so as to cover the second region 22. The pattern 44 covers the window $K_3$ in the second region 22 but exposes it in the first and third regions, 21 and 23. That is, the resin layer 6c in the first and third regions, 21 and 23, are exposed by the former etching, as shown in FIG. 11.

Figure 12:
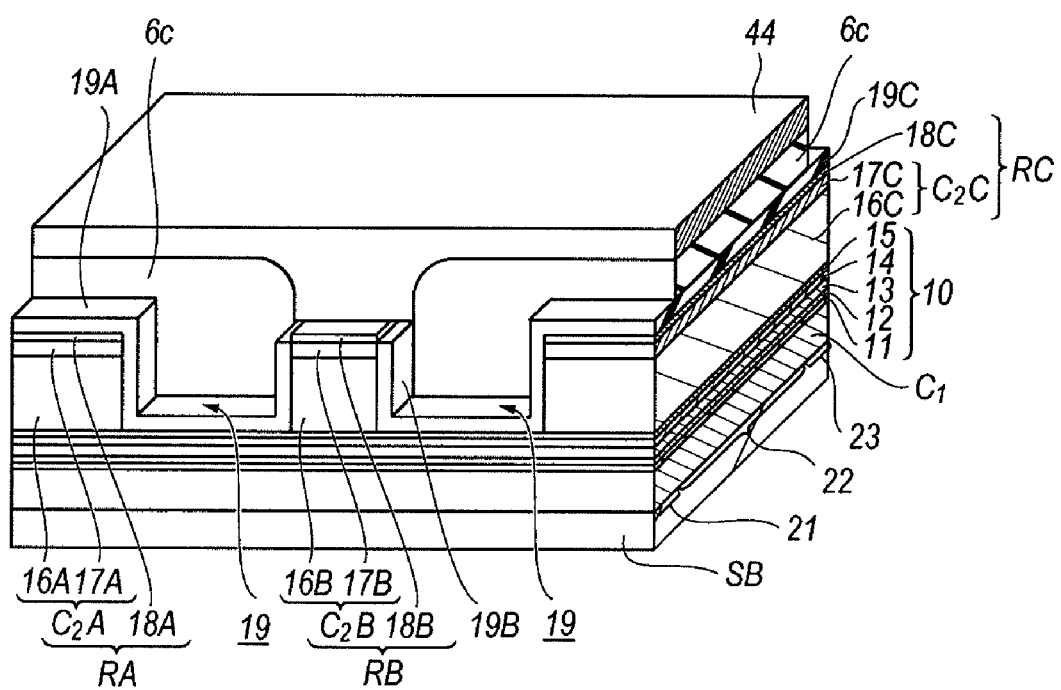
FIG. 12 shows a process to etch the edge portions of the resin layer.

As shown in FIG. 12, step S8 partially etches the resin layer 6c by using the mask 44, which exposes the edge portions, 19A to 19C, of the insulating layer 19 but leaves the resin layer 6c in the second region 22. The RIE technique using the mixture of $CH_4$ and $O_2$ with a ratio of 1:1 may etch the resin layer 6c without changing the quality of the mask 44. In particular, when the resin layer 6c is made of BCB that contains silicon (Si), the mixture of $CH_4$ and $O_2$ by an equal content may enhance the etching of the resin layer 6c because the etching concurrently forms silicon oxide which may be easily etched by $CH_4$. The RIE only using $CH_4$ may etch also the resin layer 6c. After the etching, the photoresist mask 44 may be removed by, for instance, an organic solvent.

Referring to FIG. 4 again, step S9 of the present embodiment removes the exposed cap layer 18B by, for instance, wet-etching. The cap layer 18B exists only on the exposed center ridge waveguide RB.

Referring to FIG. 4 again, step S10 of the embodiment forms the first electrode $E_1$ on top of the center cladding portion $C_2B$, and the side and the top of the insulating layer 19 by, for instance, evaporating metals. Specifically, the first electrode $E_1$ is formed so as to come in contact to the top of the cladding portion $C_2B$ and on the sides of the insulating layer 19B in the first and third regions, 21 and 23, while, it is formed so as to come in contact to the cladding portion $C_2B$ and the resin layer 6c in the second region 22. The first electrode $E_1$ makes an ohmic contact to the contact layer 17B in the cladding portion $C_2B$ through the window of the top portion 19B of the insulating layer 19; and may have a stacked metal of titanium (Ti), platinum (Pt) and gold (Au) with a thickness of 100 nm, 100 nm and 300 nm, respectively, and with a width of about 10 µm.

Figure 13:
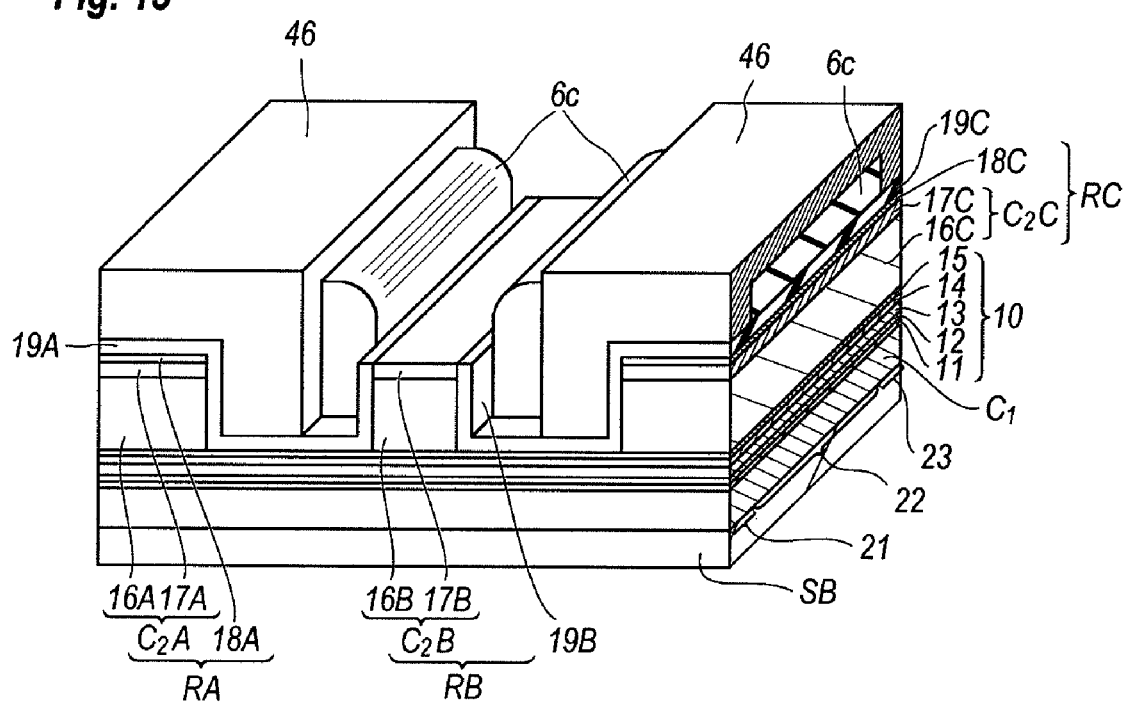
FIG. 13 shows a process to from another mask pattern for forming the first electrode.
Figure 15:
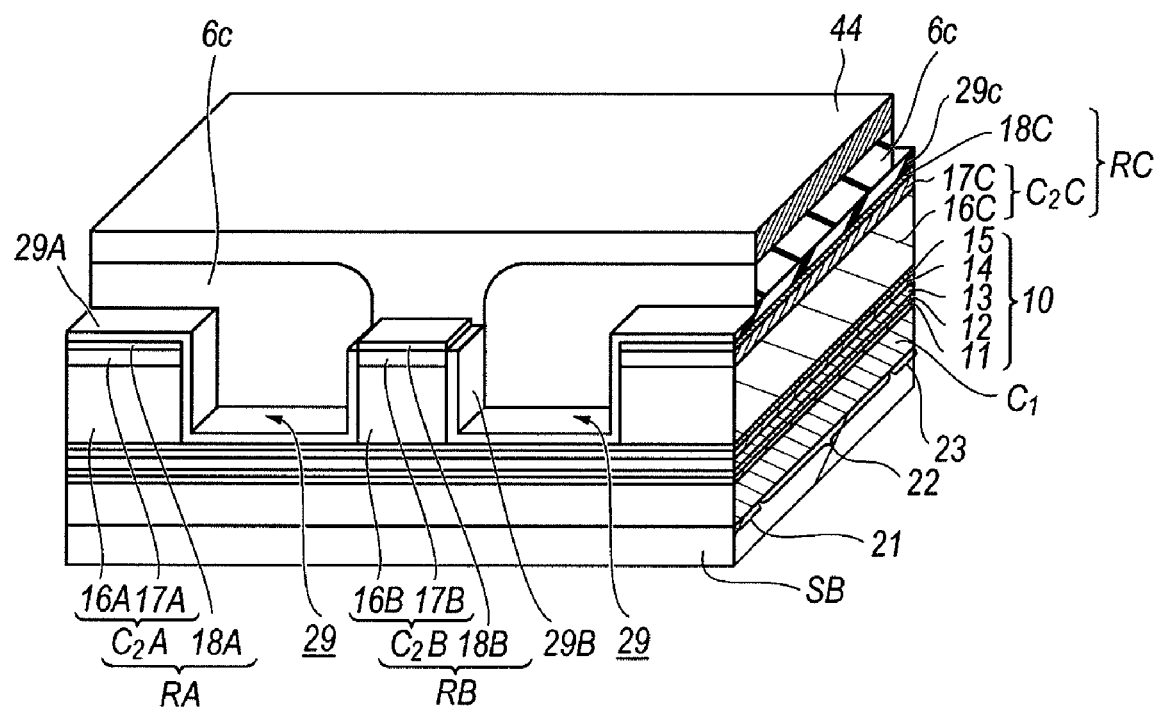
FIG. 15 shows a modified process where the exposed insulating layer in the edge regions is further etched.

Referring to FIG. 4 again, step S10 of the present embodiment subsequently forms the first electrode $E_1$ on the top of the center cladding portion $C_2B$ and the sides of the center ridge structure RB in the first and third regions, 21 and 23; and on the center cladding portion $C_2B$ and a portion of the resin layer 6c in the second region 22. Specifically, as shown in FIG. 13, the process removes the mask layer 44 by, for instance, an organic solvent and forms another resist pattern 46 by the ordinary photolithography technique. The resist pattern 46 provides a striped window in an area corresponding to the enter ridge structure RB. The contact layer 18B on the top of the upper cladding portion $C_2B$ is exposed in the bottom of the window. Portions of the resin layer 6c in both sides of the center ridge waveguide structure RB also exposes in the second region 22, but in the first and third regions, 21 and 23, the sides and the top of the insulating layer 19B are exposed. The metal evaporation of titanium (Ti), platinum (Pt), and gold (Au), where respective thicknesses are 100 nm, 100 nm and 300 nm, may be sequentially carried out to form the first electrode $E_1$. The width of the striped window, which is equivalent to the width of the first electrode $E_1$ may be 10 µm.

The process according to the present embodiment divides respective chips at step S12. FIG. 14A shows step S12 and FIG. 14B magnifies one processed chip 25. As shown in FIGS. 14A and 14B, the process divides a wafer into respective chips along horizontal lines, $_{D1}$ and $_{D2}$, the former $_{D1}$ of which locates in the first region 21, while the latter $_{D2}$ locates in the third region 23. Because two lines, $_{D1}$ and $_{D2}$, run in parallel to one of crystal axes of the substrate SB, the respective chips 25 may be obtained by the cleavage of the substrate SB. Thus, carrying out the cleavage of the substrate SB at the first and third regions, 21 and 23, after the formation of the first and second electrodes, $E_1$ and $E_2$, the edge regions, 31 and 33, and the central region 32 for the LD 1 may be obtained. The cleavage of the wafer may be done such that the cavity length of the LD 1, which corresponds to distance from one facet P to the other Q in FIG. 1, becomes about 200 µm.

After the cleavage of the substrate SB, the process coats both facets of the LD 1 with the ridge waveguide structure. Specifically, one of the facets P in the edge region 31 is coated with a film $B_1$ showing high reflectivity, while, the other facets Q in the other edge region 33 is coated with another film $B_2$ showing low reflectivity. Thus, the LD 1 with the ridge waveguide structure is completed. According to the process of the present embodiment, the etching of the resin layer 6c may expose the insulating layer 19 in the first and third regions, 21 and 23, as leaving the resin layer 6c in the second region. The first electrode $E_1$ is provided on the exposed insulating layer 19 in the first and third regions, 21 and 23. Moreover, the cleavage of the substrate SB at these first and third regions, 21 and 23, may form the edge regions, 31 and 33, for the LD 1. The resin layer 6c does not exist in these regions, 31 and 33, and the electrode $E_1$ directly comes in contact with the insulating layer 19.

The process according to the present embodiment may further etch the insulating layer 19 to make the layer thinner after exposing it. That is, the process may further provide a step to thin a portion of the insulating layers, 19A to 19C, to form thinned insulating layers, 29A to 29C, in the first and third regions, 21 and 23, respectively, after partial etching of the resin layer 6 in step S8 and before removing the exposed cap layer 18B at step S9. The process may use the etching mask 44 shown in FIG. 12 in this further etching of the insulating layer 19, and the etching may be carried out by the RIE technique using a mixture of $CF_4$ and $O_2$, the content ratio of which is preferable to be different from the ratio of the mixture used in the partial etching of the resin layer 19 performed in advance to the present etching. The ratio may be preferable from 3:1 to 5:1. Increasing the content ratio of the $CF_4$, the etching rate of the insulating layer 19 made of $SiO_2$ enhances. Moreover, the conditions of the RIE technique may be those for performing the isotropic etching, which may thin the insulating layer 19B on the sides of the center ridge waveguide structure RB. The pressure during the etching may be set to be 10 Pa or higher to get the isotropic etching condition. A wet-etching using a buffered fluoric acid substituting for the RIE technique may inherently perform the isotropic etching. Thus, the further etching may thin the insulating layer 29 to be about 200 nm in the first and third regions, 21 and 23, while, the thickness thereof in the second region 22 may be kept to be about 300 nm.

The cap layer 18B on the top of the ridge structures, RA to RC, especially on the top of the center ridge structure RB may operate as a buffer layer to absorb the etching damage affected to the upper cladding portion $C_2B$, which is caused by the RIE etching for the resin layer 6c at step S8, or, for thinning the insulating layer 19. Exposing the semiconductor layers of the upper cladding portion $C_2B$ to the plasma for a long time, the plasma causes damages on the semiconductor layers, which degrades the device performance. The cap layer 18B is preferable to be thicker than 100 nm to absorb the plasma damage, but, an excess thickness of the cap layer 18B results in an over etching for the insulating layers, 19A and 19C, and thinning the resin layer 6c in the second region 22. Thus, the thickness of the cap layer 18B is preferable to be 300 nm at most.

Figure 18:
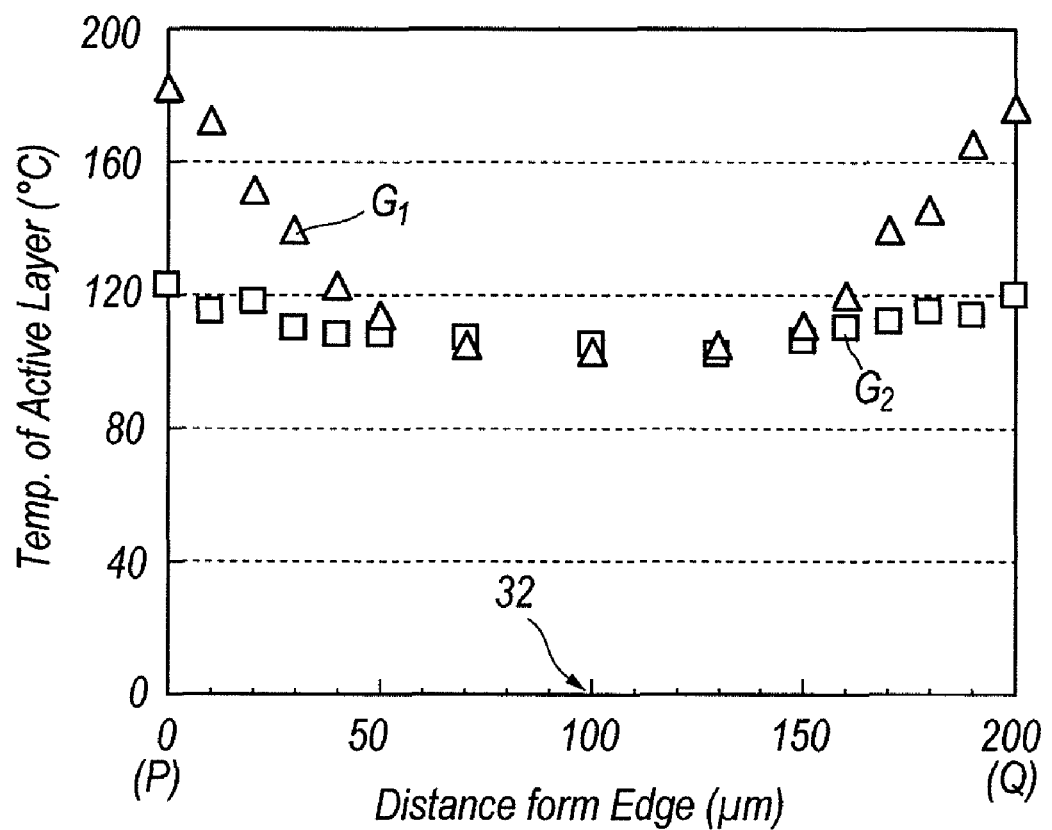
FIG. 18 compares the temperature of the active layer of the LD with the ridge waveguide structure with the arrangement of the present invention with that of the conventional LD.

Next, the heat dissipating performance of the LD with the ridge waveguide structure will be investigated as referring to FIG. 18, which shows a temperature distribution of the active layer of the LD along the ridge waveguide, where the horizontal axis denotes a distance from one edge P, while, the vertical axis shows a temperature of the active layer. Symbols $G_1$ in FIG. 18 shows the temperature distribution for a conventional LD without edge regions, that is, the resin layer 6c fully extends from one edge P to the other edge Q, while, symbols $G_2$ denotes the temperature of the active layer of the LD according to the present invention. Respective LDs are operated in a condition where an ambient temperature is set to be 85° C. and a driving current of 100 mA is provided as the bias current thereof.

The conventional LD raises the temperature of the active layer in regions close to the edges, P and Q. The central region 32 may reduce the increase of the temperature because the central region 32 continues to semiconductor materials in the edge regions; while, the edge regions, 31 and 33, continues to the air through the coating film which degrades the heat dissipating function. The LD 1 of the present embodiment, as shown by the symbols $G_2$ in FIG. 18, the temperature of the active layer may be suppressed to a level of the central region 32 even in the edge regions, 31 and 33, close to respective edges, P and Q.

Second Embodiment

Figure 16:
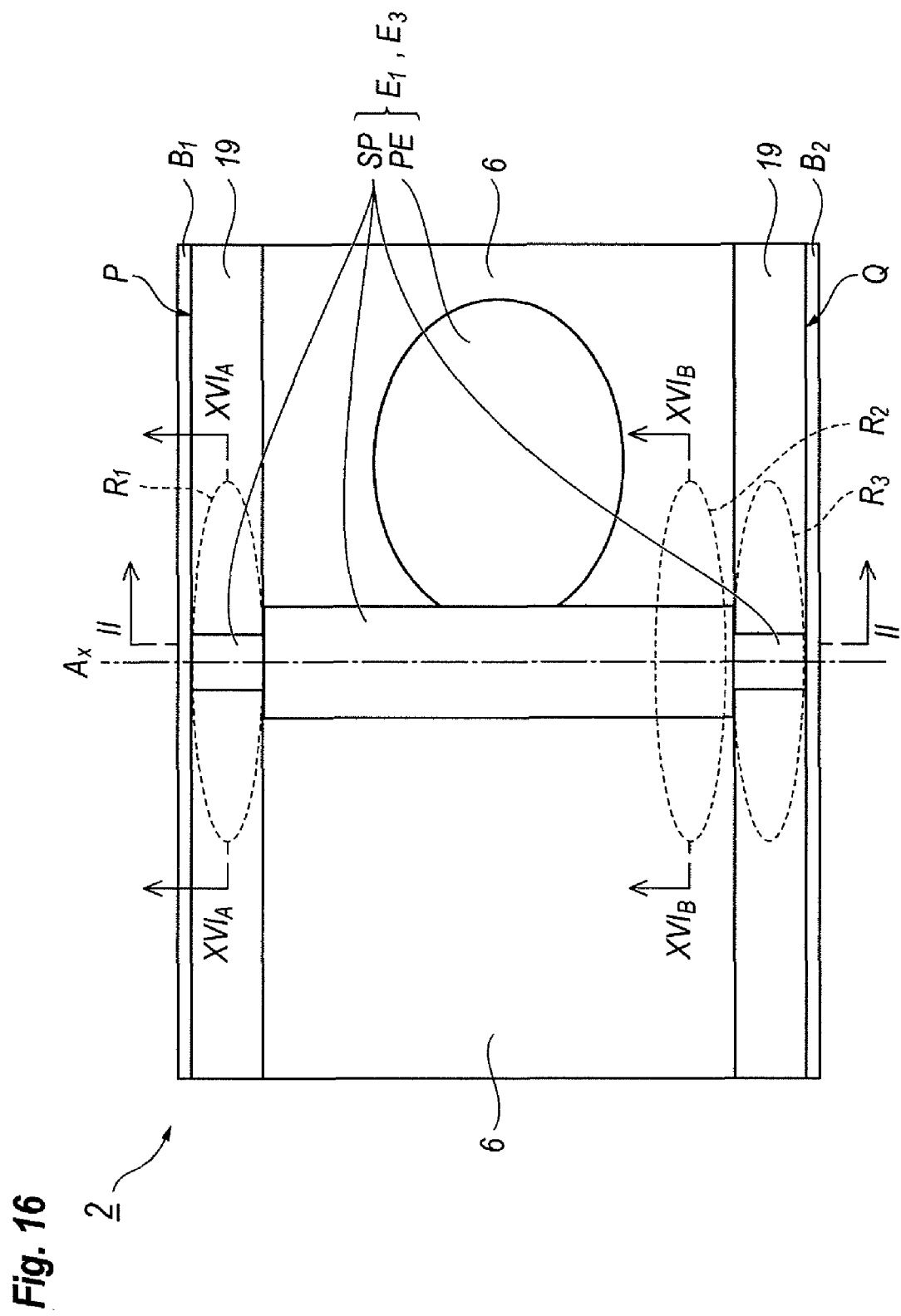
FIG. 16 is a plan view showing an LD with the ridge waveguide structure according to the second embodiment of the invention.

Next, a second embodiment according to the present invention will be described as referring to FIGS. 16 and 17. FIG. 16 is a plan view showing an LD 2 with the ridge waveguide structure, while, FIGS. 17A and 17B are cross sections of the edge region taken along the line $XVI_A$-$XVI_A$, and along the line $XVI_B$-$XVI_B$, respectively.

The LD 2 with the ridge waveguide structure of the second embodiment has a feature distinguishable from the first embodiment is that a width of striped portion SP of the first electrode $E_1$ is narrowed in the edge regions, 31 and 33. When the operational speed of the LD reaches and sometimes exceeds 10 Gbit/sec, it is preferable to decrease the capacitance, not only the junction capacitance but the parasitic capacitance, as small as possible. The LD 2 according to the second embodiment provides the first electrode $E_1$ with a narrowed stripe SP in the edge regions, 31 and 33.

Figure 17A:
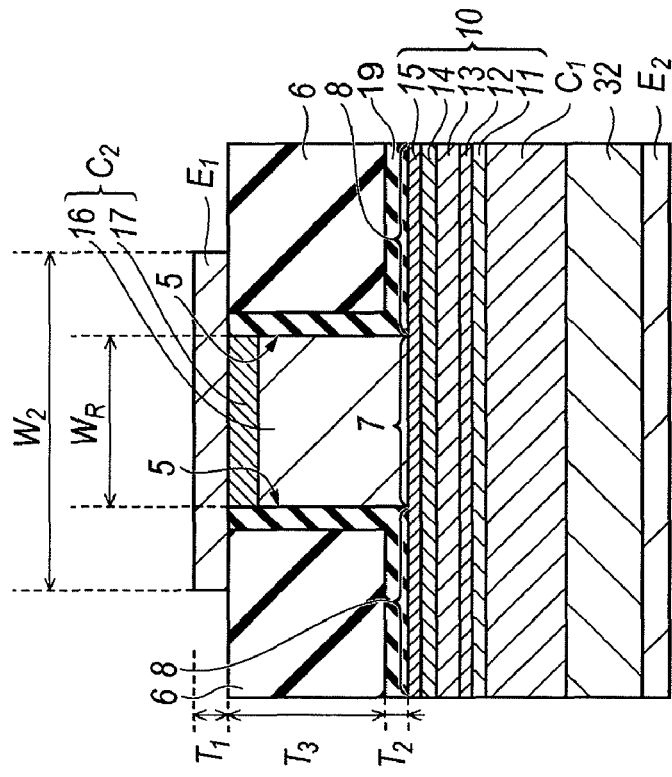
FIG. 17A is a cross section taken along the line $XVI_A$-$XVI_A$ in FIG. 16.
Figure 17B:
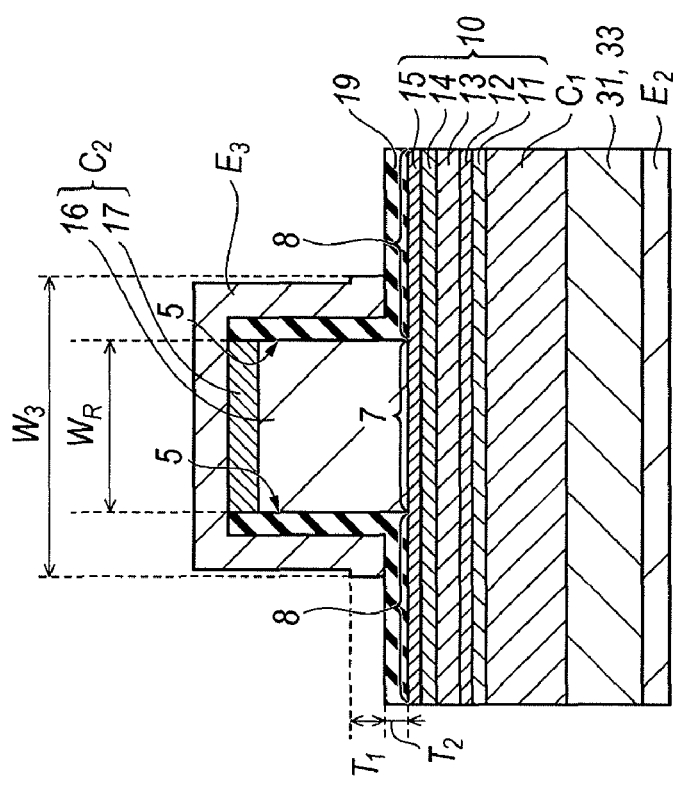
FIG. 17B is a cross section taken along the line $XVI_B$-$XVI_B$ in FIG. 16.

As shown in FIGS. 16 and 17, the first electrode $E_1$ provides the striped portion SP extending from one edge region 31 to the other edge region 33 through the central region 32, and the pad PE in the central region 32 connected to the stripe SP in the central region 32. As shown in FIGS. 17A and 17B, the width $W_3$ of the stripe SP in the edge regions, 31 and 33, is narrower than the width $W_2$ of the stripe SP in the central region 32. Because the first electrode $E_1$ and the core region 10 in the edge regions, 31 and 33, form a parallel plate capacitor; accordingly, the narrowed width $W_3$ of the stripe SP in the edge regions, 31 and 33, may suppress the increase of the parasitic capacitance there.

The narrowed width $W_3$ of the stripe SP in the edge regions, 31 and 33, may be 4 μm, while, the width $W_2$ thereof in the central region 32 may be 10 μm. However, when the first electrode $E_1$ has a narrowed width even in the central region 32, the resistance thereof increases and the inhomogeneity distribution of the carriers injected in the core region may occur. Accordingly, only the edge regions, 31 and 33, have the narrowed stripe SP of the first electrode $E_1$.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. An LD of a ridge waveguide type, comprising:
   a semiconductor substrate including two edge regions and a central region put between the edge regions;
   a core region provided on said semiconductor substrate, said core region including an active layer laterally extending in a whole of said semiconductor substrate;
   a ridge waveguide structure provided on said core region, said ridge waveguide including a cladding portion extending in a direction along which light generated in said active layer is guided;
   an insulating layer provided on a top and sides of said ridge waveguide structure and on said core region, said insulating layer having a window aligned with said ridge waveguide structure;
   a resin layer configured to bury said ridge waveguide structure in said central region; and
   an electrode extending from one facet to another facet of said LD along said ridge waveguide, said electrode directly coming in contact to said cladding portion through said window, wherein said edge regions of said substrate provide no resin layer,
wherein said electrode is provided on said top and sides of said ridge waveguide structure and on said core region through said insulating layer in said edge regions, and
wherein said electrode is provided on said top and sides of said ridge waveguide structure and on said resin layer in said central region.

2. The LD of claim 1,
wherein said edge regions have a length from 10 to 50 μm along said direction.

3. The LD of claim 1,
wherein said insulating layer has a thickness from 50 to 500 nm.

4. The LD of claim 1,
wherein said insulating layer has a thickness in said edge regions thinner than a thickness of said insulating layer in said central region.

5. The LD of claim 1,
wherein said electrode has a thickness greater than 300 nm.

6. The LD of claim 5,
wherein said electrode has a width of 5 to 20 μm.

7. The LD of claim 1,
wherein said electrode has a width in said edge regions narrower than a width of said electrode in said central region.

8. The LD of claim 1,
wherein said resin layer is made of one of BCB and polyimide.

9. The LD of claim 8,
wherein said resin layer has a thickness greater than 1 μm in said central region.

* * * * *